(12) United States Patent
Ma

(10) Patent No.: US 7,365,402 B2
(45) Date of Patent: Apr. 29, 2008

(54) LDMOS TRANSISTOR

(75) Inventor: Gordon Ma, Phoenix, AZ (US)

(73) Assignee: Infineon Technologies AG (DE)

( * ) Notice: Subject to any disclaimer, the term of this patent is extended or adjusted under 35 U.S.C. 154(b) by 305 days.

(21) Appl. No.: 11/031,784

(22) Filed: Jan. 6, 2005

(65) Prior Publication Data
US 2006/0145250 A1    Jul. 6, 2006

(51) Int. Cl.
*H01L 29/94* (2006.01)
(52) U.S. Cl. .................. 257/408; 257/335; 257/336; 257/344; 257/492; 257/493; 257/E29.027; 257/E29.066; 257/E29.256; 257/E29.266; 257/E29.278
(58) Field of Classification Search ................ 257/327, 257/335, 336, 341–343, 492, 493, E29.012, 257/E29.027, E29.066, E29.197, E29.256, 257/E29.266, 344, 408, E29.278
See application file for complete search history.

(56) References Cited

U.S. PATENT DOCUMENTS

| | | | | |
|---|---|---|---|---|
| 4,811,075 A | * | 3/1989 | Eklund | 257/369 |
| 5,132,753 A | * | 7/1992 | Chang et al. | 257/655 |
| 5,155,563 A | * | 10/1992 | Davies et al. | 257/327 |
| 5,313,082 A | | 5/1994 | Eklund | 257/262 |
| 5,907,173 A | * | 5/1999 | Kwon et al. | 257/336 |
| 6,168,983 B1 | | 1/2001 | Rumennik et al. | 438/188 |
| 6,424,007 B1 | * | 7/2002 | Disney | 257/342 |
| 6,563,171 B2 | | 5/2003 | Disney | 257/342 |
| 6,613,622 B1 | | 9/2003 | Nair et al. | 438/188 |

FOREIGN PATENT DOCUMENTS

| JP | 53119686 | 10/1978 |
|---|---|---|
| JP | 05275693 | 10/1993 |

OTHER PUBLICATIONS

J.A. Appels and H.M.J. Vaes, "High voltage thin layer devices (RESURF devices)", IEDM technical digest, pp. 238-241, 1979.
H.M.J. Vaes and J.A. Appels, "High voltage high current lateral devices", IEDM technical digest, pp. 87-90, 1980.
T. Fujihira, "Theory of Semiconductor Superjunction Devices", Jpn. J. Appl. Phys., vol. 36, pp. pp. 6254-6262, 1997.
G. Deboy, M. Marz, J.-P. Stengl, H. Strack, J. Tihanyi and H. Weber, "A new generation of high voltage MOSFETs breaks the limit line of silicon", IEDM technical digest, pp. 683-685, 1998.

(Continued)

*Primary Examiner*—Sue A. Purvis
*Assistant Examiner*—Benjamin Tzu-Hung Liu
(74) *Attorney, Agent, or Firm*—Coats & Bennett, P.L.C.

(57) ABSTRACT

An LDMOS semiconductor transistor structure comprises a substrate having an epitaxial layer of a first conductivity type, a source region extending from a surface of the epitaxial layer of a second conductivity type, a lightly doped drain region within the epitaxial layer of a second conductivity type, a channel located between the drain and source regions, and a gate arranged above the channel within an insulating layer, wherein the lightly doped drain region comprises an implant region of the first conductivity type extending from the surface of the epitaxial layer into the epitaxial layer covering an end portion of the lightly doped drain region next to the gate.

25 Claims, 7 Drawing Sheets

OTHER PUBLICATIONS

A. Ludikhuize, "A review of RESURF technology", Proc. of ISPSD, p. 11, 2000.

J. Cai, C. Ren, N. Balasubramanian and J.K.O. Sin, A novel high performance stacked LDD RF LDMOSFET, IEEE Electron Device Lett., vol. 22, No. 5, pp. 236-238, 2001.

J.G. Mena and C.A.T. Salama, "High voltage multiple-resistivity Drift-Region LDMOS", Solid State Electronics, vol. 29, No. 6, pp. 647-656, 1986.

M.D. Pocha and R.W. Dutton, "A computer-aided design model for High-Voltage Double Diffused MOS (DMOS) Transistors", IEEE Journal of Solid-State Circuits, vol. SC-11, No. 5, 1976.

I. Yoshia, M. Katsueda, S. Ohtaka, Y. Maruyama and T. Okabe; "High Efficient 1.5 GHz Si Power MOSFET for Digital Cellular Front End"; Proceedings of International Symposium on Power Semiconductor Devices & ICs; Tokyo, pp. 156-157, 1992.

Ma G et al., "High Efficiency Submicron Gate LDMOS Power Fet for Low Voltage Wireless Communications," 1997 IEEE MTT-S International Microwave Symposium Digest (pp. 1303-1306), Aug. 6, 1997.

PCT International Search Report for application No. PCT/EP2006/000042 filed Jan. 5, 2006, 7 pages, mailing date Nov. 3, 2006.

PCT Written Opinion of the International Searching Authority for application No. PCT/EP2006/000042, 8 pages, mailing date, Nov. 3, 2006.

* cited by examiner

LDMOS TRANSISTOR

TECHNICAL FIELD OF THE INVENTION

The present invention relates to an LDMOS transistor structure.

BACKGROUND OF THE INVENTION

LDMOS transistor structures are widely used as semiconductor devices for many types of transistor applications such as high voltage MOS field effect transistors. An LDMOS transistor comprises a lightly doped drain region to enhance the breakdown voltage. LDMOS transistors comprise, thus, a higher on resistance due to the lightly doped region within the drain.

FIG. 1 shows a typical power LDMOS transistor. A wafer comprises, for example, a p substrate 13 on top of which an epitaxial layer 1 is deposited. This layer 1 includes n conductivity type areas 2, 4 and 15 implanted into the surface to provide a source and drain region, respectively. The epitaxial layer 1 is usually covered with an insulating dielectric layer 7 such as silicon oxide in which a polysilicium gate 8 is arranged to cover the channel between the drain 4, 15 and source 2. The drain in this exemplary LDMOS transistor comprises a first region 15 which is $n^+$ doped and which comprises a connection to a drain electrode 12 arranged above that region 15 through a window in the insulator layer 7. This $n^+$ region is surrounded by a lighter doped $n^-$ region 4 that extends until under gate 8 to define a channel between the source and the drain region. On the source side of this transistor a $p^+$ doped sinker 14 is provided which extends from the surface of the epitaxial layer 1 down to the substrate to provide for a backside source contact. Contact 11 connects the source region 2 with the sinker 14.

The interrelation between breakdown voltage and on-resistance relates to the maximum electric field defined by the pn-junction which needs to stay below the critical electric field for the semiconductor to avoid breakdown. This maximum electrical field is defined by the doping level of, for example, the $n^-$ doped drain in a nmos field effect transistor. Furthermore, in applications in which the transistor is most of the time driven to conduct, the long on-state can lead to substantial hot carrier injection resulting in DC parametric drift. This is a very common issue with LDMOS transistor structures because the n-implant doses are increased in LDD transistors to lower the on-resistance, thus, resulting an higher junction electrical field and hot electron injection over time.

SUMMARY OF THE INVENTION

According to the present application, a new transistor structure is introduced. For example, an LDMOS semiconductor transistor structure comprises a substrate having an epitaxial layer of a first conductivity type, a source region extending from a surface of the epitaxial layer of a second conductivity type, a lightly doped drain region within the epitaxial layer of a second conductivity type, a channel located between the drain and source regions, and a gate arranged above the channel within an insulating layer, wherein an implant region of the first conductivity type is provided extending from the surface of the epitaxial layer into the epitaxial layer covering an end portion of the lightly doped drain region next to the gate.

The lightly doped drain region may comprise a first region below a drain contact and a second region extending from the first highly doped region in direction to the gate, wherein the second region is less doped than the first region. The semiconductor transistor structure may further comprise a third region surrounding the first highly doped region, wherein the third region is less doped than the first highly doped region and more doped than the second region. The semiconductor transistor structure may further comprise a sinker structure of the first conductivity type extending from the source region to the bottom of the epitaxial layer. The substrate can be heavily doped. The implant region may have an approximate horizontal length of about 0.5 µm. The implant region may have an approximate vertical length of the peak concentration of about 0.6 microns. The implant region can be partially overlapped with the lightly doped drain region. The semiconductor transistor may further comprise a well of the first conductivity type at least partly surrounding the source region and extending within the channel. The implant region may partially overlaps with the well. The first conductivity type can be a p-type and the second conductivity type is an n-type, or vice versa. The implant region can be laterally diffused. The lightly doped drain region may comprise a first region of the second conductivity type for establishing a contact with an electrode, a second region of the second conductivity type being less doped than the first region being buried within the epitaxial layer and extending from the first region horizontally in direction towards the gate, a third region being of the second conductivity type less doped than the second region and extending vertically from the surface of the epitaxial layer and horizontally from the second region until under the gate, a top layer of the first conductivity type extending from the surface of the epitaxial layer to the second region, and a bottom layer of the first conductivity type extending from the second region into the epitaxial layer. The third region may comprise a first sub-region of the second conductivity type extending from the second region horizontally towards the gate and a second sub-region of the second conductivity type extending vertically from the surface of the epitaxial layer and horizontally from the first sub-region until under the gate. The first sub-region may be less doped than the second region and the second sub-region being less doped than the first sub-region. The first sub-region may be less doped than that second region and the first and the second sub-region overlap and the first sub-region is partially less doped than the second sub-region. The semiconductor transistor structure may further comprise a voltage termination of the second conductivity type extending from the drain electrode deeper into the epitaxial layer than the first region. The second region may have an approximate horizontal length of 0.5-3 microns. The semiconductor transistor structure may further comprise a field plate arranged between the drain electrode and the gate electrode on top of the insulating layer which at least partially covers the gate electrode.

An LDMOS semiconductor transistor structure may also comprise means of a first conductivity type for forming a substrate having an epitaxial layer, means of a second conductivity type for forming a source extending from a surface of the epitaxial layer, means of a second conductivity type for forming a lightly doped drain region within said epitaxial layer, a channel located between said means for forming a drain and said means for forming a source, means for forming a gate arranged above said channel within an insulating layer, and means for forming an implant region of the first conductivity type extending from the surface of the epitaxial layer into the epitaxial layer overlapping an end portion of the lightly doped drain region next to the gate and extending within a portion of said channel.

The lightly doped drain region may further comprise means for forming a first highly doped region below a drain contact and means for forming a second region extending from said first region in direction to the gate, wherein the second region is less doped than the first region. The implant region can be partially overlapped with the means for forming a second region. The semiconductor transistor may further comprise means for forming a well of said first conductivity type at least partly surrounding said means for forming the source and extending within said channel. The implant region may partially overlaps with said well. The means for forming the implant region may cause a lateral diffusion of said implant.

A method for manufacturing a LDMOS transistor structure having a substrate and epitaxial layer of a first conductivity type, comprises the steps of forming a source region and a lightly doped drain region of a second conductivity type in the epitaxial layer, forming at least a gate electrode covering a channel region between the source and lightly doped drain region, forming a photo resist layer covering the surface of transistor structure, opening a window in the photo resist layer uncovering an end portion of the lightly doped drain region next to the gate, and implanting a pocket region of the first conductivity type through the window.

The window may uncover a part of the gate electrode. The window may have a preferred horizontal size of about 0.5 µm. The step of implanting may create a pocket with the peak concentration vertical length of 0.6 microns. The drain region may comprise a first highly doped region below a drain contact and a second region extending from the first highly doped region in direction to the gate, wherein the second region is less doped than the first highly doped region. The lightly doped drain region further may comprise a third region surrounding the first highly doped region, wherein the third region is less doped than the first highly doped region and more doped than the second region. The pocket region can be partially overlapped with the second lightly doped drain region. The pocket region can also be laterally diffused under the gate. The method may further comprise the step of forming a well of the first conductivity type which at least partly surrounds the source region and extends within said channel. The implant region may partially overlap with this well. A sinker structure of the first conductivity type can be formed within the epitaxial layer extending from the source region to the bottom of the epitaxial layer. The substrate can be heavily doped. The first conductivity type can be a p-type and the second conductivity type is an n-type, or vice versa.

Also, an LDMOS semiconductor transistor structure may comprise a substrate having an epitaxial layer of a first conductivity type, a source region extending from a surface of the epitaxial layer of a second conductivity type, a lightly doped drain region within the epitaxial layer of a second conductivity type comprising a first region below a drain contact and a second region extending from the first region in direction to the gate, wherein the second region is less doped than the first region, a channel located between the drain and source regions, and a gate arranged within an insulating layer above the channel, wherein the lightly doped drain region comprises an implant region of the first conductivity type extending from the surface of the epitaxial layer into the epitaxial layer covering an end portion of the lightly doped drain region next to the gate.

The semiconductor transistor structure may further comprise a third region surrounding the first region, wherein the third region is less doped than the first region and more doped than the second region. The semiconductor transistor structure may further comprise a sinker structure of the first conductivity type extending from the source region to the bottom of the epitaxial layer. The substrate can be heavily doped. The implant region may have an approximate horizontal length of about 0.5 microns. The implant region may have an approximate peak concentration vertical length of about 0.6 microns. The first conductivity type can be a p-type and the second conductivity type can be an n-type, or vice versa. The semiconductor transistor structure may further comprise a field plate arranged between the drain electrode and the gate electrode on top of the insulating layer which at least partially covers the gate electrode. The implant region can be partially overlapped with the second region. The semiconductor transistor structure may further comprise a well of the first conductivity type at least partly surrounding the source region and extending within the channel. The implant region may partially overlap with the well.

Other technical advantages of the present disclosure will be readily apparent to one skilled in the art from the following figures, descriptions, and claims. Various embodiments of the present application obtain only a subset of the advantages set forth. No one advantage is critical to the embodiments.

BRIEF DESCRIPTION OF THE DRAWINGS

A more complete understanding of the present disclosure and advantages thereof may be acquired by referring to the following description taken in conjunction with the accompanying drawings, in which like reference numbers indicate like features, and wherein.

DETAILED DESCRIPTION OF THE PREFERRED EMBODIMENTS

Figure 1:
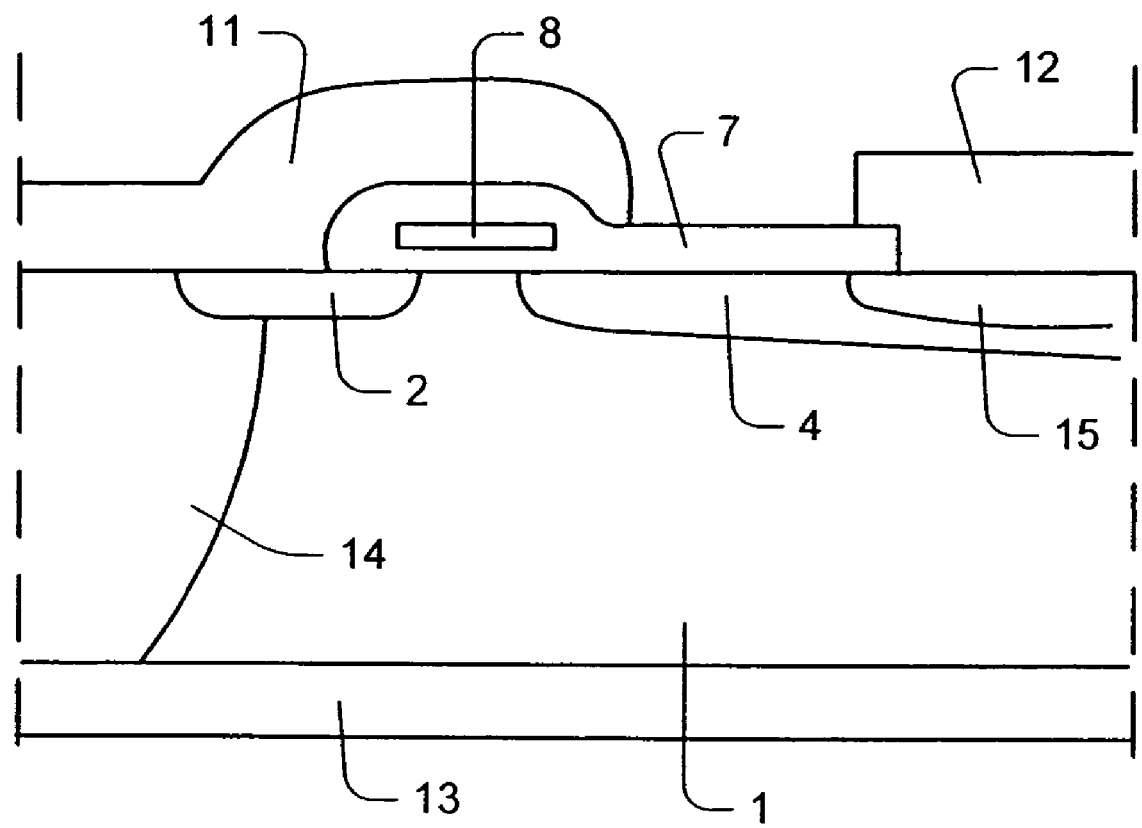
FIG. 1 is a partial sectional view of a semiconductor wafer including a transistor structure according to the prior art.
Figure 2:
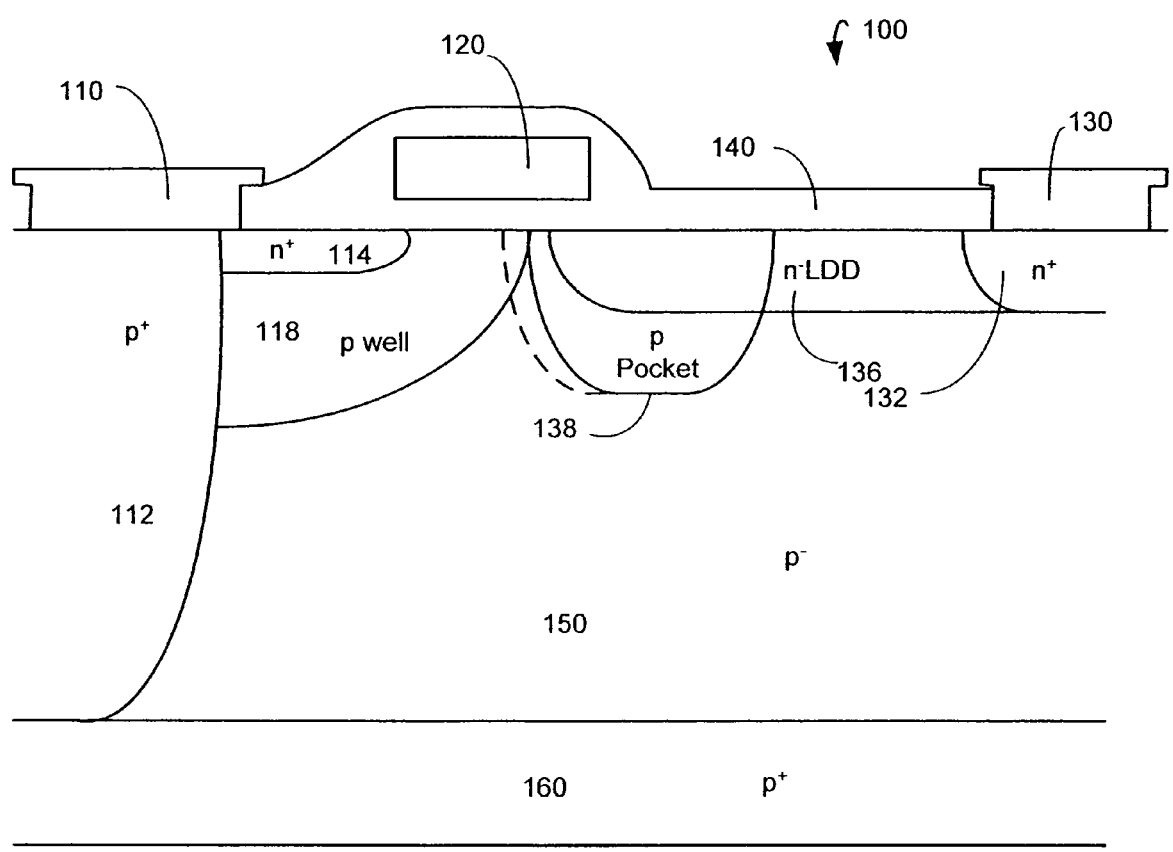
FIG. 2 is a partial sectional view of a semiconductor wafer including a transistor structure according to an embodiment of the present application.

Turning to the drawings, exemplary embodiments of the present application will now be described. FIG. 2 depicts an improved transistor structure according to an exemplary embodiment of the present invention. On top of a $p^+$ substrate 160, a $p^-$ epitaxial layer 150 is arranged. For example, the substrate can be doped heavily with $10^{18}$-$10^{19}$/$cm^3$ and the epitaxial layer can be less doped with $10^{14}$-$10^{15}$/$cm^3$. Along the top surface of the epitaxial layer 150, a source region 114 extends laterally from the source side of gate 120 to an electrode or metal interconnection 110. This source region can be embedded in a p well 118 as shown in FIG. 2. The contact 110 connects the oppositely doped source region 114 and a $p^+$ sinker region 112. The $p^+$ sinker region 112 reaches from the source region 114 to the $p^+$ substrate 160. A source metal contact (not shown) can be placed along the entire backside of the wafer. Again an insulator layer 140 is placed on the top surface of the epitaxial layer 150 and comprises a gate 120 and windows for respective drain and source electrodes 130, 110. On top of the insulator layer 140, usually a passivation layer (not shown) is deposited.

The improved transistor structure comprises a drain region with an LDD region consisting of a first lightly doped region 136 extending from under the gate 120 to a highly doped region 132 under the drain electrode 130 as shown in FIG. 2. Other embodiments of LDD regions are also possible. The implant dose of region 136 could be, for example, $2E10^{12}/cm^2$ and for region 132, for example, $5E10^{15}/cm^2$.

Figure 4:
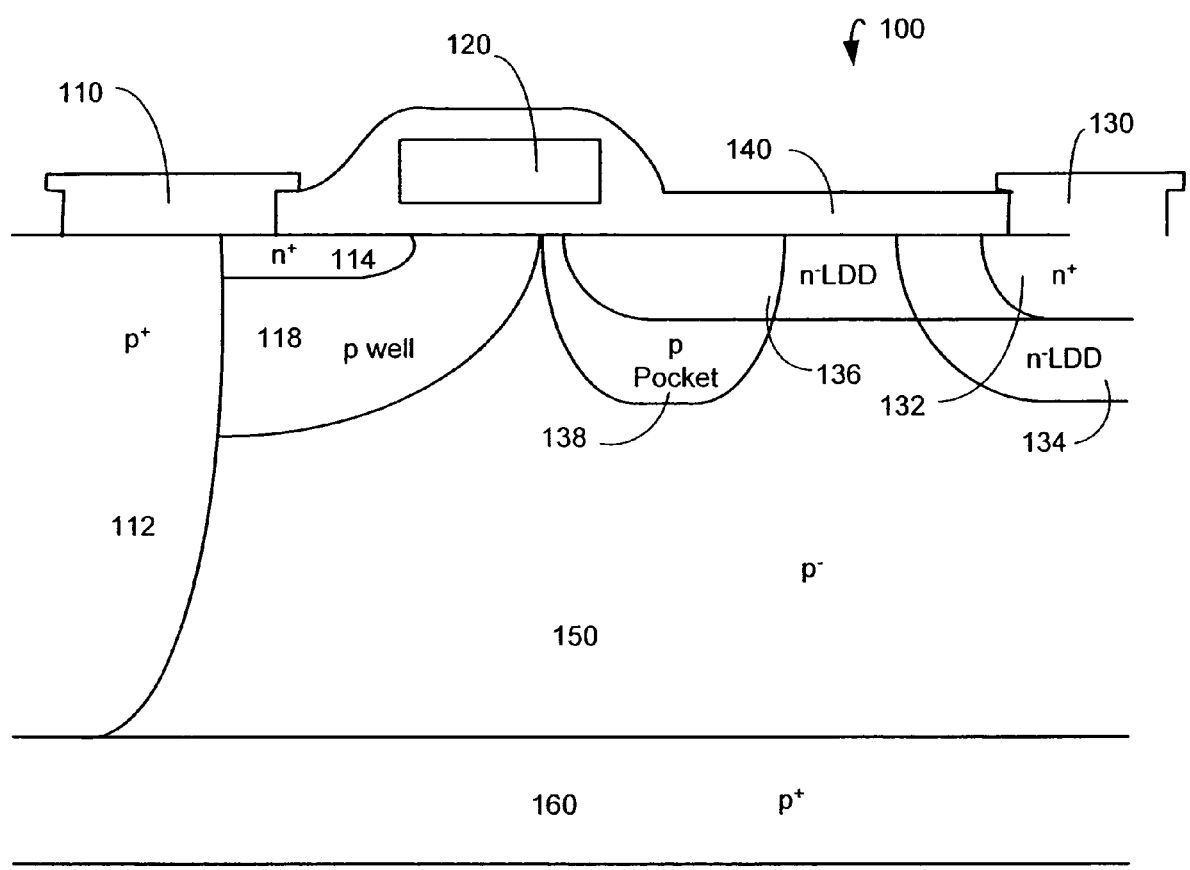
FIG. 4 shows a partial sectional view of another embodiment according to the present invention.

Other types of LDD transistors can be used, for example, transistors with multiple graded layers as for example shown in FIG. 4. The embodiment is similar to the embodiment shown in FIG. 2. Thus, similar regions carry the same numerals. In this exemplary embodiment, a graded junction is created by a multilayer structure. A first region 136 being n⁻ doped extends from under gate 120 close to the drain contact electrode 130. From this n⁻ doped region 136 and under the drain contact electrode 130 follows again an n⁺ doped region 132 which extends about as deep as layer 136 into the epitaxial layer. However, in another embodiment, n⁻ doped region 134 can surround n⁺ region 132 and reach deeper into the epitaxial layer 150. The implant dose of region 132 could be, for example, $5E10^{15}/cm^2$, for region 134, $4E10^{12}/cm^2$ and for region 136 could be, again for example, $2E10^{12}/cm^2$.

In addition for the exemplary embodiments, a p doped pocket implant 138 extends from the top surface of epitaxial layer 150 into the epitaxial layer 150. This p doped pocket implant 138 overlaps with the end portion of the first drain region 136 on the side of the gate 120 facing the drain electrode 130. The p doped pocket implant 138 also reaches on the other side into the channel covered by the gate 120. For a low frequency type transistor and for transistors with a long gate/channel length the p doped pocket implant 138 can reach as far into the channel up to touching the p well 118 or even overlap this p well 118. However, as indicated with the dotted line, in high frequency applications and for transistors with a short gate/channel length, the p doped pocket implant 138 can actually in a preferred implementation overlap with the p well 118. This pocket implant 138 reaches deeper into the epitaxial layer 150, thus forming a barrier. This implant 138 can compensate 10-20% of N-LDD dose 136, locally suppress the drain to channel junction E-field and hot electron injection, thus, reducing channel length modulation and any type of DC bias current drift over time. The hot electron injection is a localized effect, usually occurs within 0.5 μm distance of the drain side of the gate. The implant region may further have an approximate vertical length of the peak concentration of about 0.6 microns. The resistance $R_{dson}$ is a distributed value over a few micron of the drain dimension. By optimizing the p pocket implant conditions, for example, by using an implant dose of $5E10^{11}/cm^2$ and 180 KeV Boron or any other suitable p-type implant and by increasing the n-implant LDD implant dose for regions 136, for example to >$2E10^{12}/cm^2$ a substantial reduction of Rdson and improvement in RF performance of a power LDMOS transistor can be achieved without increasing DC bias current drift over time. This kind of implant also provides for a particular more lateral diffusion profile because of the diffusion characteristics of Boron and the high implant energy.

Figure 5:
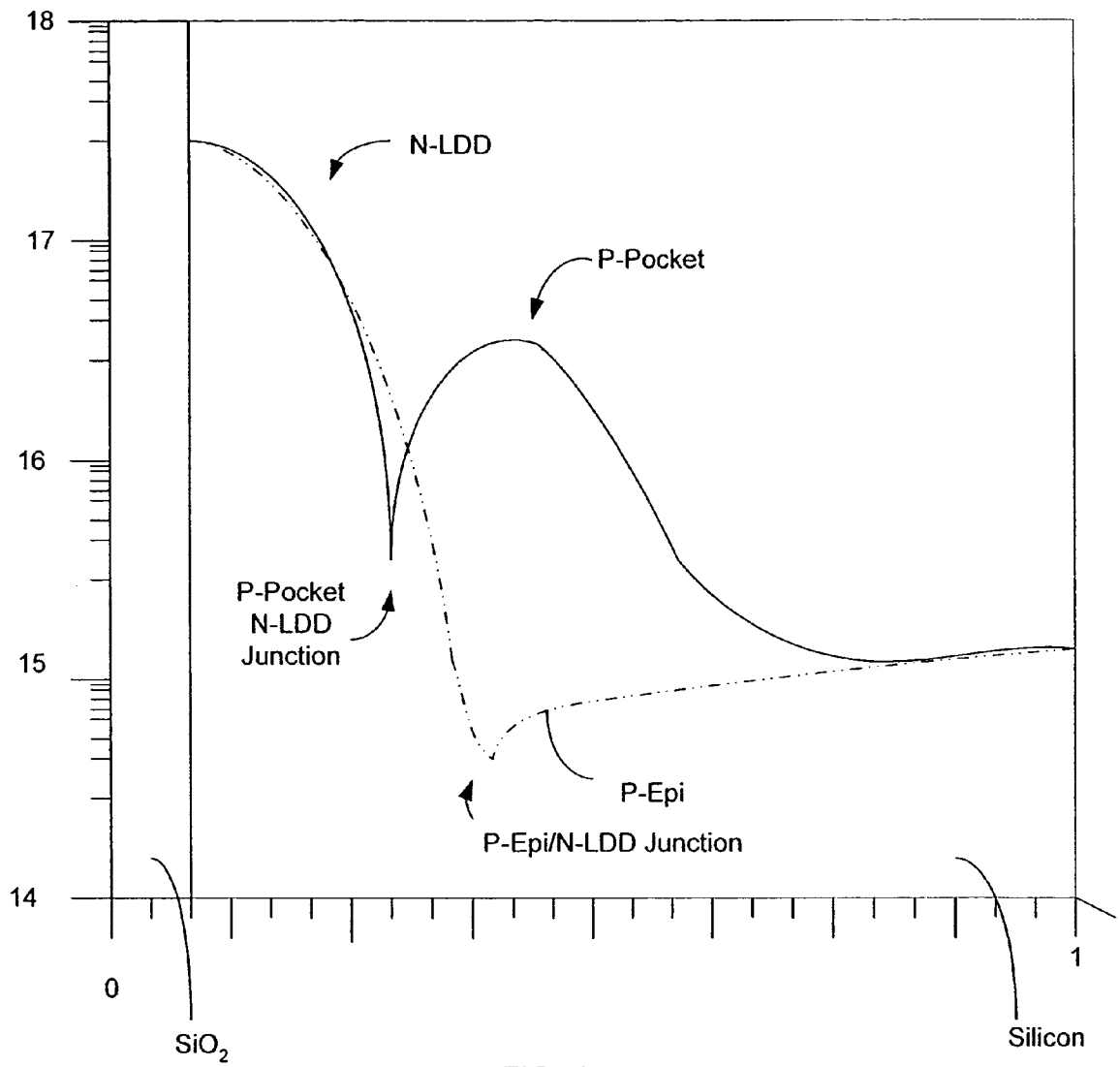
FIG. 5 shows graphs from a process simulation of a transistor structure according to the present application.

FIG. 5 shows a possible exemplary deep pocket implant vertical profile. The deep P-pocket implant doping profile compensates 10-20% N-LDD dose and shift the P-pocket/N-LDD junction closer to the surface as compared to P-epi/N-LDD junction. The deep P-pocket implant will laterally diffuse underneath the drain side of the gate to suppresses the depletion region growth into the channel with increasing drain bias Vds, thus, suppressing the channel length modulation and DC parametric drift.

Figure 3A:
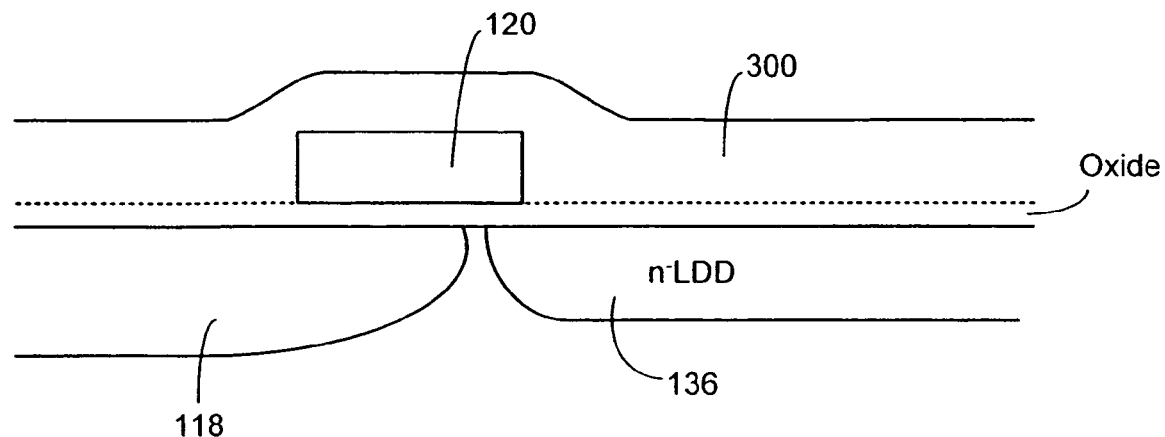
FIG. 3A-B are exemplary steps in the manufacturing process for a transistor structure according to an embodiment of the present application.
Figure 3B:
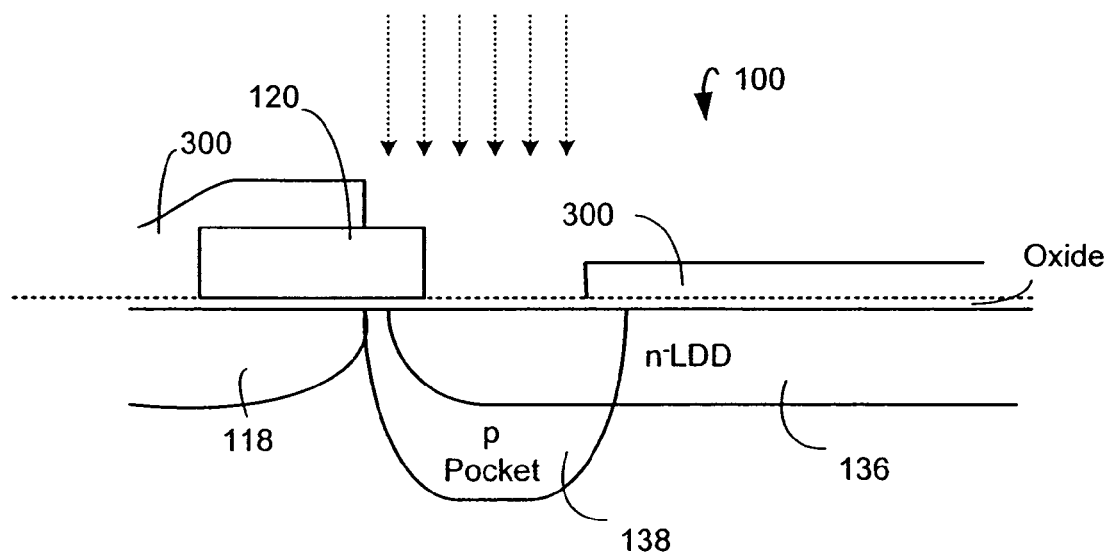

The p pocket 138 can be advantageously implanted using a self-alignment process as shown, for example, in FIGS. 3a-b. FIG. 3a shows for example, parts of an LDD transistor with implanted drain region 136. During following steps, source and drain metal contacts 110 and 130 and gate 120 may be formed (not shown). thus, a thin oxide layer covers the surface of the epitaxial layer 150. In a next step, a window in a photo resist layer 300 covering the gate 120 and metal contacts 110 and 130 is formed as shown in FIG. 3b. This window may preferably uncover a small part of gate 120 which, in this example, forms a left barrier for the following implant step. However, the window can also just extend to the left edge of the gate. The window may have a preferred horizontal size of about 0.5 μm. Thus, this pocket will influence the $R_{dson}$ the least while be still effective for hot electron injection suppression by reducing the junction E-field.

Figure 6:
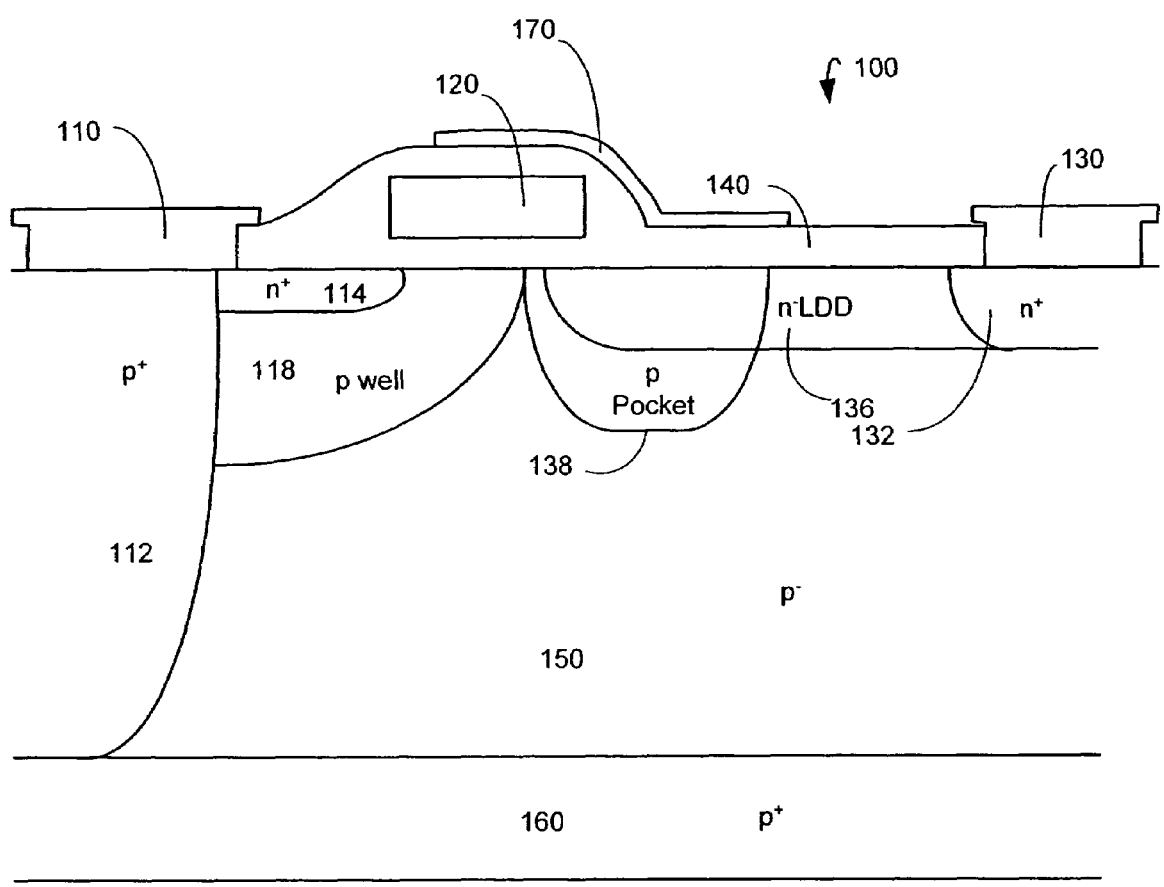
FIG. 6 shows a partial sectional view of yet another embodiment according to the present invention.

FIG. 6 shows yet another embodiment similar to the embodiment shown in FIG. 4. Again, similar elements carry similar numerals. In addition to the structure as shown in FIG. 4, this embodiment furthermore includes a field plate 170 arranged to at least partially cover the gate electrode. To this end, this field plate 170 is placed on top of the oxide 140 covering the gate electrode. This field plate 170 furthermore reaches as far to the right of the gate electrode to cover the p-pocket 138 in this embodiment.

Figure 7:
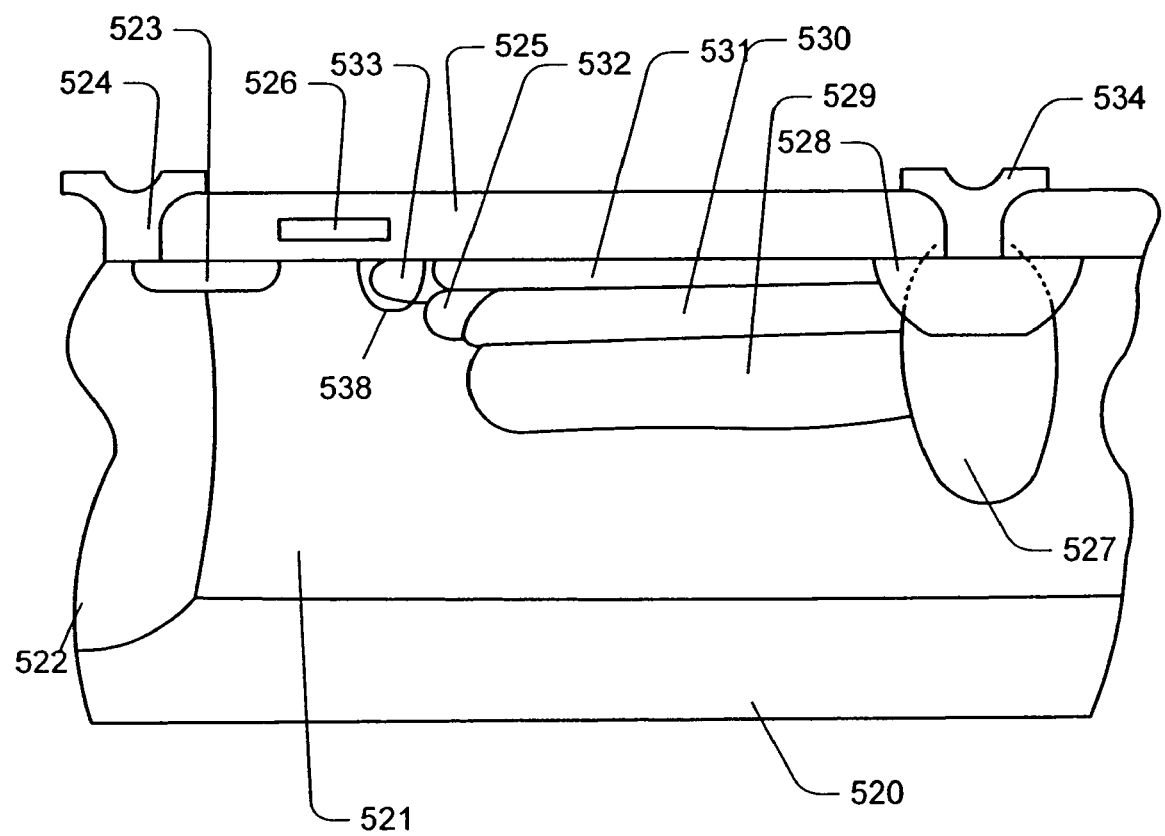
FIG. 7 shows a partial sectional view of yet another embodiment according to the present invention.

FIG. 7 shows yet another embodiment of an improved transistor structure according to the present invention. On top of a p⁺ substrate 520, a p epitaxial layer 521 is arranged. Again, the substrate can be doped heavily, for example, with $10^{19}/cm^3$ and the epitaxial layer can be less doped with $10^{15}/cm^3$. Along the top surface of the epitaxial layer 521, a source region 523 extends laterally from the source side of gate 526 to an electrically floating electrode or metal interconnection 524. The electrically floating contact 524 connects the oppositely doped source region 523 and a p⁺ sinker region 522. The p⁺ sinker region 522 reaches from the source region 523 to the p⁺ substrate 520. A source metal contact (not shown) is placed along the entire backside of the wafer. Again an insulator layer 525 is placed on the top surface of the epitaxial layer 521 and comprises a gate 526 and windows for respective drain and source electrodes 524, 534. On top of the insulator layer 525, usually a passivation layer (not shown) is deposited.

The improved transistor structure comprises a drain region with a multiple layer arrangement as shown in FIG. 7. In this exemplary embodiment, a graded superjunction is created by this multilayer structure. A first relatively short resulting region 533 being n⁻ doped extends from under gate 526 to the drain contact electrode 534. Between this short n⁻ doped region 533 and the drain contact electrode 534 follows a second n⁻ doped region 532 which extends deeper into the epitaxial layer 521. In one embodiment, a graded doping concentration from region 533 to region 528 with increasing doping concentration is obtained. However, other embodiments are possible. In one preferred embodiment, the maximum doping concentration of this region 532 is not necessarily higher than the maximum doping concentration for region 533. The implant dose of region 532 could be less than that of region 533. However, the region 532 implant overlaps with the region 533 implant and is partially compensated by the region 531 implant. The doping overlap between regions 532 and 533 results in a higher doping concentration in the part of the overlap region of 532 as compared to the region 533 and a lower doping concentration in the remaining part of region 532. This is because the doping concentration of region 533 drops with vertical distance from the top surface. Region 532, in this particular embodiment has, thus, two functions. The overlapping part of region 532 is used to carry the current whereas the lesser doped part of that region is used to relax the electrical field. Thus, different graded junctions from region 533 to region 530 can be formed which still are within the scope of the present application.

Furthermore in this embodiment, region 532 does not reach the surface of the epitaxial layer 521. However, depending on the doping concentration, this layer could also reach to the top surface of epitaxial layer 521. Between the second n⁻ doped region 532 and the drain contact electrode 534 extends a relatively long (appr. 1-3 microns) n doped conducting stripe 530 which couples the n⁻ doped region 532 with a heavily doped n⁺ region 528 that extends from drain electrode 534 into the epitaxial layer 521. Thus, the drain starts with a heavily doped n⁺ region 528 from the electrode 534 that gradually ends in a lightly doped n⁻ region 533 under the gate 526. The n doped conducting stripe may have an approximate horizontal length of 1-3 microns and is basically shielded by an implanted p doped top layer 531 and bottom layer 529 that extend from the heavily n⁺ doped region 528 horizontally towards gate 526 for substantially the length of the n doped conducting layer 530. In the center of the drain region starting under the drain electrode 534 a n⁺ doped termination region 527 is implanted which reaches from the surface deep into the epitaxial layer 521. Region 528 is higher doped than region 527. Also, region 527 is higher doped than region 529. This is necessary to avoid breakdown between the drain contact 534 and region 529.

The lowly doped n⁻ region 533 close to gate 526 keeps the electric field low to suppress hot carrier injection into the gate and also to avoid early breakdown of the structure. Furthermore, this region 533 keeps the feedback capacitance Cdg between the gate and the drain low. The second or intermediate n⁻ doped region 532 can be provided for trade-off between on-resistance, breakdown of the transistor structure, hot carrier injection, and feedback capacitance Cdg. The intermediate n⁻ doped implant region 532 can be produced, for example, through a 0 degree off-set implant mask or a tilted angle self-aligned implant mask. Such a structure with vertically alternating layers 531, 530, 529 and the graded regions 533, 532, 528 and 527 forms a new combination of superjunctions and graded junctions. The advantage with this concept lies in the fact that the highly doped conducting layer is depleted from both top and bottom, thus, also enabling a high breakdown voltage despite the higher doping concentration of the n conducting stripe. By the introduction of laterally graded junctions 533, 532, and 529 close to the gate 526, an optimization of several critical parameters affecting radio frequency performance is made possible. In addition to optimization of on-resistance and breakdown voltage, the graded junctions keep the electric field low at the gate oxide to suppress hot carrier injection (low drift), which is an important issue for LDMOS transistors. Moreover, the critical feedback capacitance Cdg can be kept at a low value. On the right side, a deep high energy implant 527 prevents breakdown to occur between the drain contact 534 and region 529.

All regions can be created by ion implantation. The n conducting stripe can be created as a buried layer and is being depleted from the top and the bottom through layers 531 and 529, respectively. In particular implanted p layer 529 depletes the n conducting stripe 530 from the bottom which makes it possible to increase the doping concentration of the n conducting stripe. The top p layer 531 depletes the n conducting stripe from above. There is a lowly doped n⁻ region 533 close to the gate oxide 526 to keep the electric field low around this critical 'corner'. This suppresses hot carrier injection into the gate oxide 526, avoids early breakdown and keeps the feedback capacitance Cdg low. The intermediate doped n⁻ implanted region 532 serves as an overlapping region between the n⁻ region 533 and the n conducting stripe 530. The depth and doping concentration of this implant is used to optimize the trade-off between on-resistance, breakdown voltage, hot carrier injection and feedback capacitance Cdg.

Again, in addition to the multilayered drain region, a p doped pocket implant 538 extends from the top surface of epitaxial layer 521 into the epitaxial layer 521. This pocket implant 538 reaches again deeper into the epitaxial layer 521, thus forming a barrier. This implant 538 can, thus, compensate 10-20% of N-LDD dose 533; locally suppress the drain to channel junction E-field and the channel length modulation, thus, reducing hot electron injection and any type of DC bias current drift over time. Again, the hot electron injection is a localized effect, usually occurs within 0.5 μm distance of the drain side of the gate. The resistance $R_{dson}$ is a distributed value over a few micron of the drain dimension. The p pocket implant can be optimized in a similar way as described above.

Although particular embodiments of the invention have been shown and described, the invention is not limited to the preferred embodiments and it will be apparent to those skilled in the art that various changes and modifications may be made without departing from the scope of the invention, which is defined only by the appended claims and their equivalents. For example, the substrate can be a p-type or an n-type substrate. Thus, source and drain region would be either of the n-type or the p-type, respectively. Also other combinations of specific features of the shown embodiments are possible. For example, a p well can be added to the embodiment shown in FIG. 7 or the p well as shown in embodiments of FIGS. 2, 4, and 6 can be omitted. Furthermore, the structure according to the present application can be used for lateral and vertical transistor structures.

What is claimed is:

1. An LDMOS semiconductor transistor structure comprising:

a substrate having an epitaxial layer of a first conductivity type;

a source region of a second conductivity type extending from a surface of the epitaxial layer;

a lightly doped drain region of a second conductivity type within said epitaxial layer;

a channel located between said drain and source regions; and a gate arranged above said channel within an insulating layer;

wherein an implant region of the first conductivity type is provided extending from the surface of the epitaxial layer into the epitaxial layer overlapping an end portion of the lightly doped drain region next to the gate and extending within a portion of said channel and being spaced apart from said source region.

2. The semiconductor transistor structure as claimed in claim 1, wherein said lightly doped drain region comprises a first highly doped region below a drain contact and a second region extending from said first region in direction to the gate, wherein the second region is less doped than the first region.

3. The semiconductor transistor structure as claimed in claim 2, further comprising a third region surrounding said first highly doped region, wherein the third region is less doped than the first highly doped region and more doped than the second region.

4. The semiconductor transistor as claimed in claim 2, wherein the implant region is partially overlapped with the second region.

5. The semiconductor transistor structure as claimed in claim 1, further comprising a sinker structure of said first conductivity type extending from said source region to the bottom of said epitaxial layer.

6. The semiconductor transistor structure as claimed in claim 1, wherein said implant region has an approximate horizontal length of about 0.5 μm.

7. The semiconductor transistor structure as claimed in claim 1, wherein said implant region has an approximate vertical length of the peak concentration of about 0.6 microns.

8. The semiconductor transistor as claimed in claim 1, further comprising a well of said first conductivity type at least partly surrounding said source region and extending within said channel.

9. The semiconductor transistor as claimed in claim 8, wherein said implant region partially overlaps with said well.

10. The semiconductor transistor structure as claimed in claim 1, wherein the implant region is laterally diffused.

11. The semiconductor transistor structure as claimed in claim 1, wherein the lightly doped drain region comprises:
   a first region of said second conductivity type for establishing a contact with an electrode;
   a second region of said second conductivity type being less doped than said first region being buried within said epitaxial layer and extending from said first region horizontally in direction towards said gate;
   a third region being of said second conductivity type less doped than said second region and extending vertically from the surface of said epitaxial layer and horizontally from said second region until under said gate;
   a top layer of said first conductivity type extending from the surface of said epitaxial layer to said second region; and
   a bottom layer of said first conductivity type extending from said second region into said epitaxial layer.

12. The semiconductor transistor structure as claimed in claim 11, wherein said third region comprises a first sub-region of said second conductivity type extending from said second region horizontally towards said gate and a second sub-region of said second conductivity type extending vertically from the surface of said epitaxial layer and horizontally from said first sub-region until under said gate.

13. The semiconductor transistor structure as claimed in claim 12, wherein said first sub-region being less doped than said second region and said second sub-region being less doped than said first sub-region.

14. The semiconductor transistor structure as claimed in claim 12, wherein said first sub-region being less doped than that second region and said first and said second sub-region overlap and said first sub-region is partially less doped than said second sub-region.

15. The semiconductor transistor structure as claimed in claim 11, further comprising a voltage termination of the second conductivity type extending from the drain electrode deeper into the epitaxial layer than the first region.

16. The semiconductor transistor structure as claimed in claim 11, wherein said second region has an approximate horizontal length of 1-3 microns.

17. The semiconductor transistor structure as claimed in claim 1, further comprising a field plate arranged between the drain and the gate on top of the insulating layer wherein the field plate at least partially covers the gate.

18. The semiconductor transistor structure as claimed in claim 11, further comprising a field plate arranged between the drain and the gate on top of the insulating layer wherein the field plate at least partially covers the gate.

19. An LDMOS semiconductor transistor structure comprising:
   means of a first conductivity type for forming a substrate having an epitaxial layer;
   means of a second conductivity type for forming a source extending from a surface of the epitaxial layer;
   means of a second conductivity type for forming a lightly doped drain region within said epitaxial layer;
   a channel located between said means for forming a drain and said means for forming a source;
   means for forming a gate arranged above said channel within an insulating layer; and
   means for forming an implant region of the first conductivity type extending from the surface of the epitaxial layer into the epitaxial layer overlapping an end portion of the lightly doped drain region next to the gate, extending within a portion of said channel, and being spaced apart from said source region.

20. The semiconductor transistor structure as claimed in claim 19, wherein said lightly doped drain region comprises means for forming a first highly doped region below a drain contact and means for forming a second region extending from said first region in direction to the gate, wherein the second region is less doped than the first region.

21. The semiconductor transistor as claimed in claim 20, wherein the implant region is partially overlapped with the means for forming a second region.

22. The semiconductor transistor structure as claimed in claim 19, further comprising means for forming a well of said first conductivity type at least partly surrounding said means for forming the source and extending within said channel.

23. The semiconductor transistor structure as claimed in claim 22, wherein said implant region partially overlaps with said well.

24. The semiconductor transistor structure as claimed in claim 19, wherein said means for forming the implant region cause a lateral diffusion of said implant.

25. An LDMOS semiconductor transistor structure comprising:
   a substrate having an epitaxial layer of a first conductivity type;
   a source region of a second conductivity type extending from a surface of the epitaxial layer;
   a lightly doped drain region of a second conductivity type within said epitaxial layer;
   a channel located between said drain and source regions;
   a gate arranged above said channel within an insulating layer;

a well of said first conductivity type at east partly surrounding said source region and extending within said channel; and an implant region of the first conductivity type extending from the surface of the epitaxial layer into the epitaxial layer overlapping an end portion of the lightly doped drain region next to the gate and extending within a portion of said channel, and wherein said implant region is spaced apart from said source region and partially overlaps with said well.

* * * * *